United States Patent [19]

Parmenter et al.

[11] Patent Number: 5,026,454
[45] Date of Patent: Jun. 25, 1991

[54] VACUUM EVAPORATION AND DEPOSITION

[75] Inventors: John J. Parmenter, Crawley; Robert B. Phillips, Horsham; Paul R. Stonestreet, Pagnall, all of Great Britain

[73] Assignee: VG Instruments Group Limited, Crawley, England

[21] Appl. No.: 269,570

[22] Filed: Nov. 10, 1988

[30] Foreign Application Priority Data

Nov. 13, 1987 [GB] United Kingdom ............... 8726639

[51] Int. Cl.$^5$ ........................................... C23C 14/24
[52] U.S. Cl. .................................. 156/614; 156/600; 156/601; 156/610; 427/255.7; 118/706; 118/715
[58] Field of Search ............. 156/601, DIG. 103, 610, 156/614; 427/255.7; 118/715, 706

[56] References Cited

U.S. PATENT DOCUMENTS

| 4,411,728 | 10/1983 | Sakamoto | 156/606 |
| 4,575,462 | 3/1986 | Dobson | 156/601 |
| 4,640,720 | 2/1987 | Foxon | 118/720 |
| 4,681,773 | 7/1987 | Bean | 118/719 |

*Primary Examiner*—Richard Bueker
*Attorney, Agent, or Firm*—Chilton, Alix & Van Kirk

[57] ABSTRACT

Method and apparatus for the deposition of material onto a substrate, the method comprising evaporating material from a source, controlling the dosage of material at the substrate by moving a shutter between an open position and a closed position, with a closing step comprising beginning to decelerate said shutter before reaching the closed position, subsequently thereby bringing the shutter substantially to rest at the closed position. Preferably the motion of the shutter is substantially harmonic with the acceleration of the shutter being directed towards, and proportional to the distance of the shutter from, the point mid-way between the open and closed positions. Contamination is reduced from prior methods and the invention is especially advantageous in molecular beam epitaxy.

24 Claims, 3 Drawing Sheets

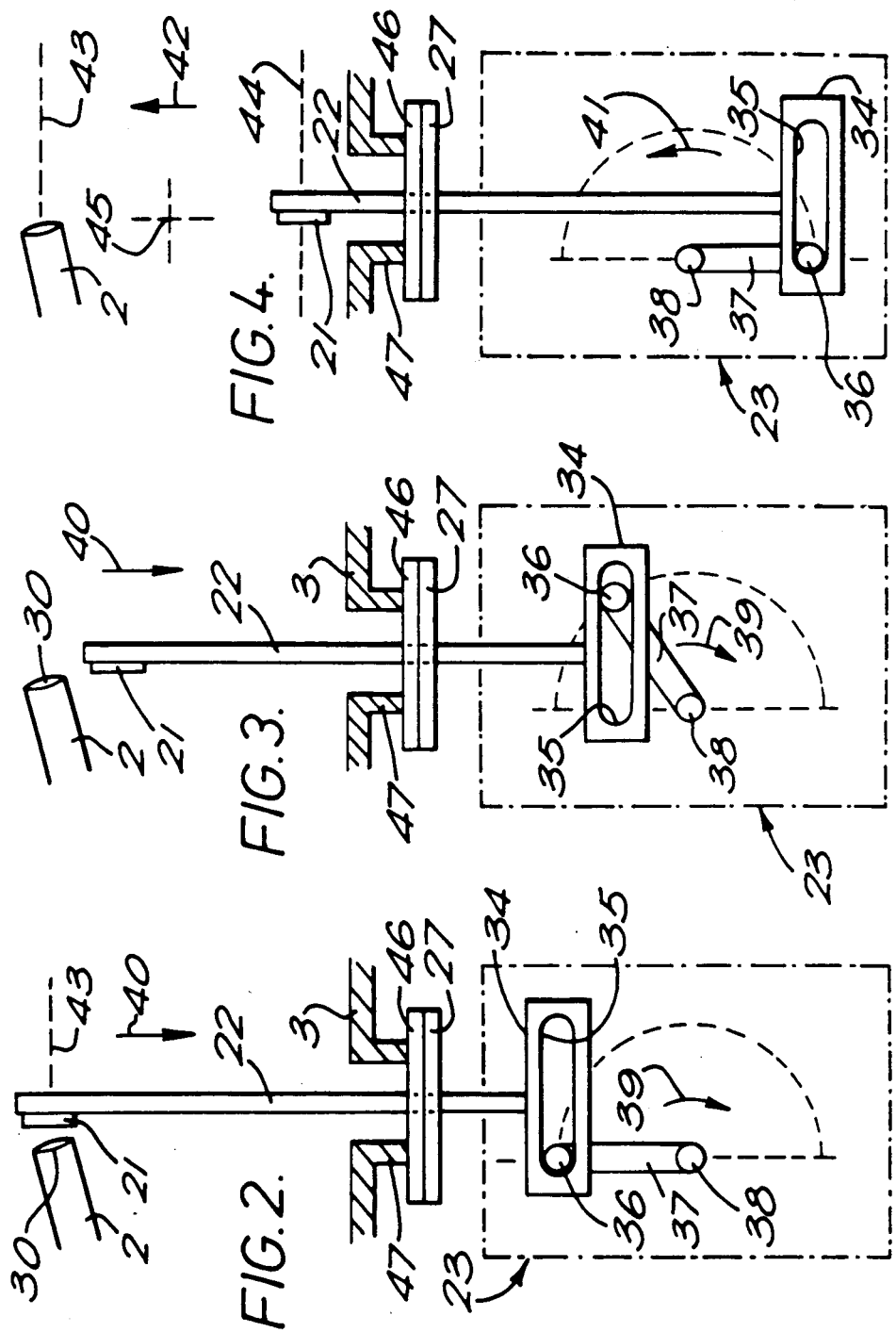

VACUUM EVAPORATION AND DEPOSITION

This invention relates to the deposition of evaporated material upon substrates in high vacuum, particularly though not exclusively to a method of, and apparatus for, molecular beam epitaxy.

Molecular beam epitaxy (MBE) is the epitaxial deposition of material from a molecular, or atomic, beam onto a substrate in ultra high vacuum (UHV) conditions, i.e. in pressures of the order of $10^{-8}$ Pa ($10^{-10}$ mbar, $7.5 \times 10^{-11}$ torr) or less. MBE is one of a number of techniques of vacuum deposition and is particularly advantageous because it provides the capability of controlling deposition with high precision such as for the deposition of material with monolayer thickness. The technique is especially useful in the fabrication of high performance microelectronic devices. MBE has been reviewed, for example, by L. L. Chang in the Handbook on Semiconductors, published by the North-Holland Publishing Company in 1980.

In techniques for vacuum deposition the material to be deposited is first evaporated from a source which is usually a mass of the material contained in a hearth or crucible. In MBE the material is formed into a molecular beam from a beam source, particularly of the type known as a Knudsen cell, as described in European Patent Specification No. 0122088. The flow of material from the vapour or beam source may be controlled by shutters typically as described in U.S. Pat. Nos. 4,137,865, 4,411,728 and 4,640,720. In MBE in particular the actions of opening or closing the shutters must be fast enough, typically less than 0.2 seconds, to start or stop the beam sharply thereby to achieve accurate dosage of material at the substrate.

In the manufacture of microelectronic devices, and generally in the deposition of thin films, it is important to minimise contamination of the deposited material and substrate. High vacuum conditions, and for MBE ultra high vacuum conditions, are maintained to minimise contamination from the residual atmosphere of the work chamber. However contamination may arise from other sources such as the walls of the vacuum chamber or components of the vapour source or beam source.

It is therefore an object of the invention to provide a method for the deposition of material onto a substrate in which the contamination of the material and substrate is reduced from that in known methods. It is a further object of the invention to provide an improved method of molecular beam epitaxy with controlled beam dosage and with less contamination of beam material than in prior methods. It is also an object of the invention to provide an improved apparatus for the deposition of material onto a substrate, and it is a particular object to provide an apparatus for molecular beam epitaxy in which contamination of the source material and the substrate is reduced from that of prior apparatus.

Thus according to one aspect of the invention there is provided a method for the deposition of material onto a substrate comprising evaporating said material from a source, and controlling the dosage of said material at said substrate by moving a shutter between (i) an open position in which said shutter does not block the path of said material from said source to said substrate, and (ii) a closed position in which said shutter substantially blocks said path; said method comprising a closing step, comprising: beginning to decelerate said shutter before reaching said closed position, subsequently thereby bringing said shutter substantially to rest at said closed position.

Preferably the method also comprises an opening step, comprising: beginning to decelerate the shutter before reaching the open position, thereby bringing the shutter substantially to rest at the open position.

In a preferred embodiment, the method comprises:

a closing step, comprising accelerating the shutter away from the open position, continuing to accelerate the shutter after movement has started, and subsequently beginning to decelerate the shutter before reaching the closed position; and an opening step, comprising accelerating the shutter away from the closed position, continuing to accelerate the shutter after movement has started, and subsequently beginning to decelerate the shutter before reaching the open position.

It is convenient to call the duration of the closing step 'the closing time', and that of the opening step 'the opening time'. The closing step preferably comprises accelerating the shutter away from the open position during substantially the whole of half of the closing time, and subsequently decelerating the shutter, during substantially the whole of half of the closing time, to come substantially to rest at the closed position. Preferably also the opening step comprises accelerating the shutter away from the closed position during substantially the whole of half of the opening time, and subsequently decelerating the shutter, during substantially the whole of half of the opening time, to come substantially to rest at the open position.

Preferably the method also comprises: during the closing time, accelerating the shutter from rest at the open position, to a maximum velocity at a point substantially mid-way between the open position and the closed position, and then decelerating the shutter to come to rest at the closed position; and during the opening time accelerating the shutter from rest at the closed position, to a maximum velocity at a point substantially mid-way between the closed position and the open position, and then decelerating the shutter to come to rest again at the open position. Preferably the motion of the shutter comprises motion in which the acceleration of the shutter is directed towards, and is proportional to the distance of the shutter from, some point, preferably the point mid-way between the open and closed positions; such motion is conveniently referred to as 'simple harmonic motion', or 'harmonic motion' hereafter. Preferably the motion of the shutter comprises substantially harmonic motion during both the closing and opening times.

In a preferred embodiment there is provided a method of molecular beam epitaxy comprising alternately opening and closing a molecular or atomic beam source by moving a shutter with substantially harmonic motion centred about a mean point mid-way between an open position and a closed position; the open and the closed positions being the two extreme displacements of the harmonic motion about said mean point. Typically the shutter is moved to open (or to close) the beam source within an opening time (or a closing time) of approximately 0.2 seconds or less. The beam source may, however, remain open (or closed) between movements for any length of time required by the deposition process.

According to another aspect there is provided an apparatus for the deposition of material onto a substrate and comprising a source of said material and a shutter, there being a closed position and an open position of which in said closed position said shutter is disposed between said source and said substrate thereby blocking the path of said material from said source to said substrate, and in said open position said shutter does not block the path of said material from said source to said substrate; said apparatus also comprising a shutter control mechanism for moving said shutter with movement comprising substantially harmonic motion centred about a mean point substantially mid-way between said closed position and said open position.

Preferably the motion of the shutter is substantially rectilinear along an axis between the closed and open positions. The shutter control mechanism preferably comprises a radius arm, to which is attached a pin, and a means is provided to rotate the radius arm about a pivot; also, there is formed either in the shutter or preferably in a member attached to the shutter a pin-guiding slot, angled to the axis of movement of the shutter, and the pin attached to the radius arm is located in the pin-guiding slot. The action of rotating the radius arm moves the pin in the pin-guiding slot, thereby applying a force to the member in which the slot is formed (which may be the shutter itself) and consequently moving the shutter along its axis of movement. Preferably the pin-guiding slot is angled at substantially 90° to the axis of movement of the shutter. It is further preferred that the radius arm is rotated with substantially constant angular velocity, imparting substantially linear harmonic motion to the shutter.

The source substrate and shutter will be located within a vacuum enclosure, and it is convenient to place the shutter control mechanism outside that enclosure, and to provide a shaft, with the shutter fixed at one end, and linked at its other end to the control mechanism. The motion of the shaft is accommodated by means comprising a vacuum compatible linear motion vacuum feedthrough, preferably comprising a bellows, although alternatively a magnetically coupled motion feedthrough could be used.

In a preferred embodiment the shutter control mechanism is mounted by means comprising a support member projecting outside the vacuum chamber from a flange, there being provided a cage capable of sliding along the support member parallel to the axis of movement of the shaft and shutter, with the shaft connected to the cage, and also with one face of the cage having formed in it a pin-guiding slot substantially perpendicular to said axis of movement; there being located in said slot a pin fixed to a rotatable radius arm. The radius arm may be rotated about a pivot by means of a pneumatic actuator, which is conveniently mounted on the projecting support member using magnetic couplings for ease of removal, and subsequent replacement; it may be necessary to remove the pneumatic actuator when the vacuum system is baked to attain UHV conditions. In a preferred embodiment linear track bearings are provided to facilitate movement of the cage on the projecting support member, and spring washers also are provided to apply compressive forces to the bearings, thereby substantially preventing movement of the cage perpendicular to the axis of movement of the shutter. Movement of the shutter between the extremes of harmonic motion, corresponding to the closed and open positions, is achieved by rotating the radius arm through 180°. In a preferred embodiment, employing a pneumatic actuator, it is convenient to rotate the radius arm in one rotational sense to open the shutter and in the opposite rotational sense to close the shutter. It is within the scope of the invention to provide a continuous 360° rotation and this would provide a pulsed beam at a repetition rate related to the frequency of the rotation.

The apparatus provide a means for opening and closing the shutter of a beam source, and could be used in any form of vacuum evaporation technique where dosage from a source needs to be controlled, although it is especially advantageous in MBE. In an especially preferred embodiment the invention provide an apparatus for molecular beam epitaxy comprising an atomic or molecular beam source, a shutter and a shutter control mechanism as described above. We have found, with such an apparatus and method, that contamination from material dislodged by vibration or shock from surfaces of components, and in particular from shutters, is considerably reduced over prior systems. There are the additional advantages that the shutter control mechanism is quieter in use and is less prone to mechanical wear than in prior systems.

A preferred embodiment of the invention will now be described in greater detail, by way of example and with reference to the figures in which:

FIGS. 2, 3 and 4 illustrate the operation of the shutter control mechanism, in schematic form;

Figure 1:
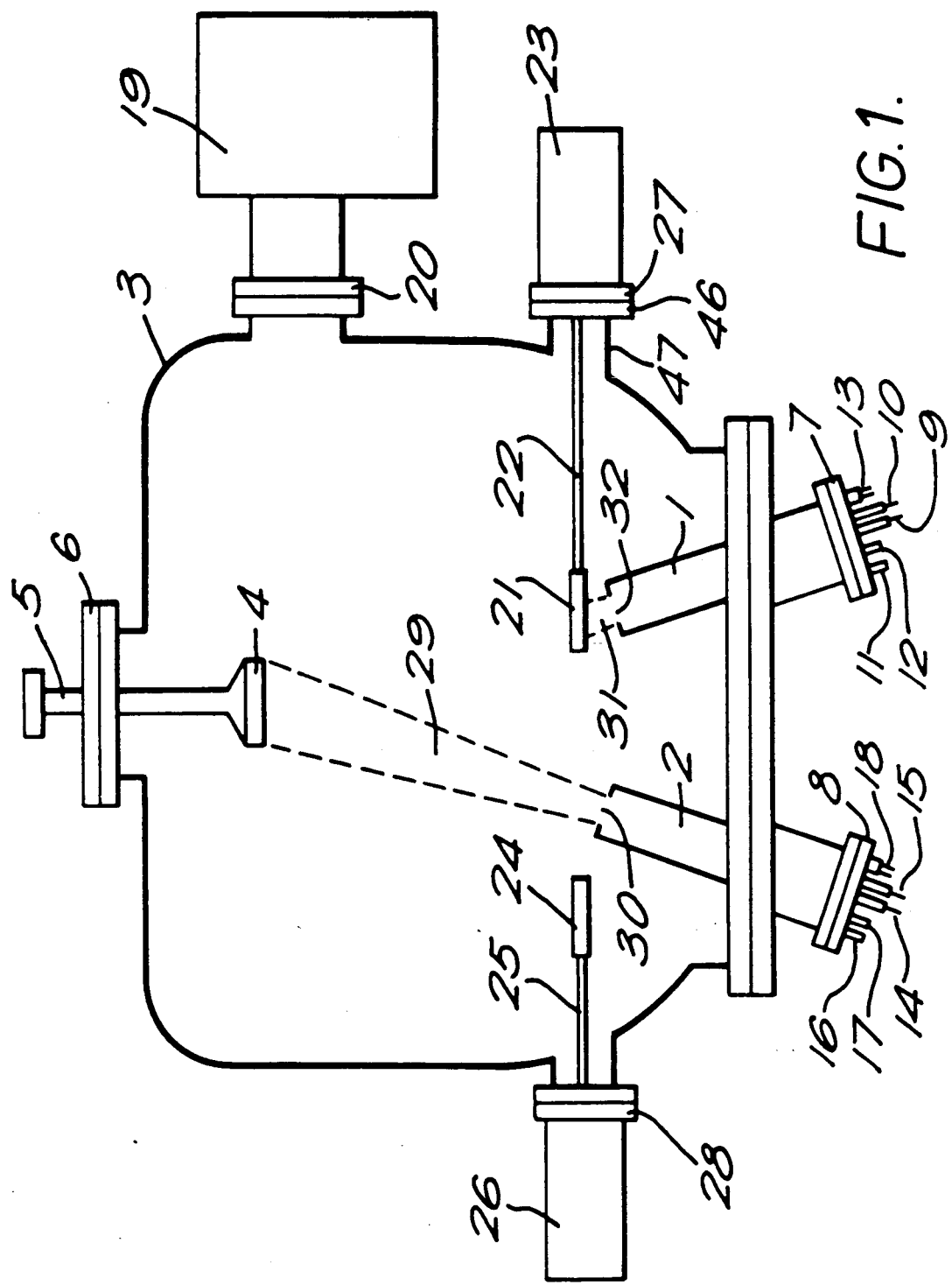
FIG. 1 illustrates, in schematic form, an apparatus for molecular beam epitaxy according to one aspect of the invention.

Referring first to FIG. 1, molecular beam sources 1 and 2 are disposed within a vacuum enclosure 3 which also contains a substrate 4 supported by a manipulator 5 mounted on a flange 6. Beam sources 1 and 2, mounted on flanges 7 and 8, are Knudsen cells, perferably though not necessarily constructed as described in European Patent Specification No. 0122088. Services applied to beam source 1 are: electrical power via feedthroughs 9 and 10, cooling liquid (usually water) via feedthroughs 11 and 12, and temperature sensing via a thermocouple (not shown) attached to feedthrough 13; beam source 2 is similarly supplied via feedthroughs 14 to 18. Also shown symbolically in FIG. 1 is a vacuum pump 19 mounted on a flange 20 and capable of maintaining ultra high vacuum conditions as required for MBE within enclosure 3. It will be appreciated that suitable vacuum gauges will be provided. The apparatus may also contain instruments for analysing the surface of substrate 4 to monitor the progress of the epitaxial deposition, as for example the instrumentation for Reflection High Energy Electron Diffraction as provided in the V80 MBE system manufactured by VG Semicon Ltd of East Grinstead, England.

Also shown in FIG. 1 are shutters 21 and 24 mounted on shafts 22 and 25 respectively, along with their respective shutter control mechanisms 23 and 26 (shown schematically in FIG. 1 but described in greater detail below) mounted on flanges 27 and 28. Shutter 24 is shown in the open position, in which it does not block the path from source 2 to substrate 4 thereby allowing material 29 to travel from an exit hole 30 of source 2 to substrate 4. Shutter 21 is shown in the closed position blocking the path of material 31 from an exit hole 32 of source 1 to substrate 4.

The operation of the shutter control mechanisms will now be described with reference to FIGS. 2, 3 and 4. The description will refer to shutter 21 and its associated mechanism 23 but applies equally to shutter 24 and its mechanism 26. An MBE system according to the invention may contain several beam sources each having such a shutter and control mechanism, as may be required for dosing a substrate with several materials in sequence, or simultaneously.

FIG. 2 shows shutter 21 in a closed position 43. Shaft 22 is attached to a cage 34 which has a guiding slot 35. A pin 36 is located in slot 35 and is also affixed to a radius arm 37 which is capable of rotation about a pivot 38. As arm 37 rotates in the direction of an arrow 39 shutter 21 is moved away from the closed position in the direction of an arrow 40. The motion continues as shown in FIG. 3 until, as shown in FIG. 4, the shutter is disposed in an open position at 44. The shutter may remain at open position 44 for the time required to expose substrate 4 to material from source 2 and then the direction of rotation of arm 37 is reversed, in the direction of an arrow 41 as shown thereby moving shutter 21 back, in the direction of an arrow 42, to the closed position 43 of FIG. 2. In this way, by moving arm 37 with a substantially constant angular velocity about pivot 38 it is ensured that shutter 21 moves with substantially harmonic motion about a point 45 midway between open position 43 and closed position 44.

Figure 5:
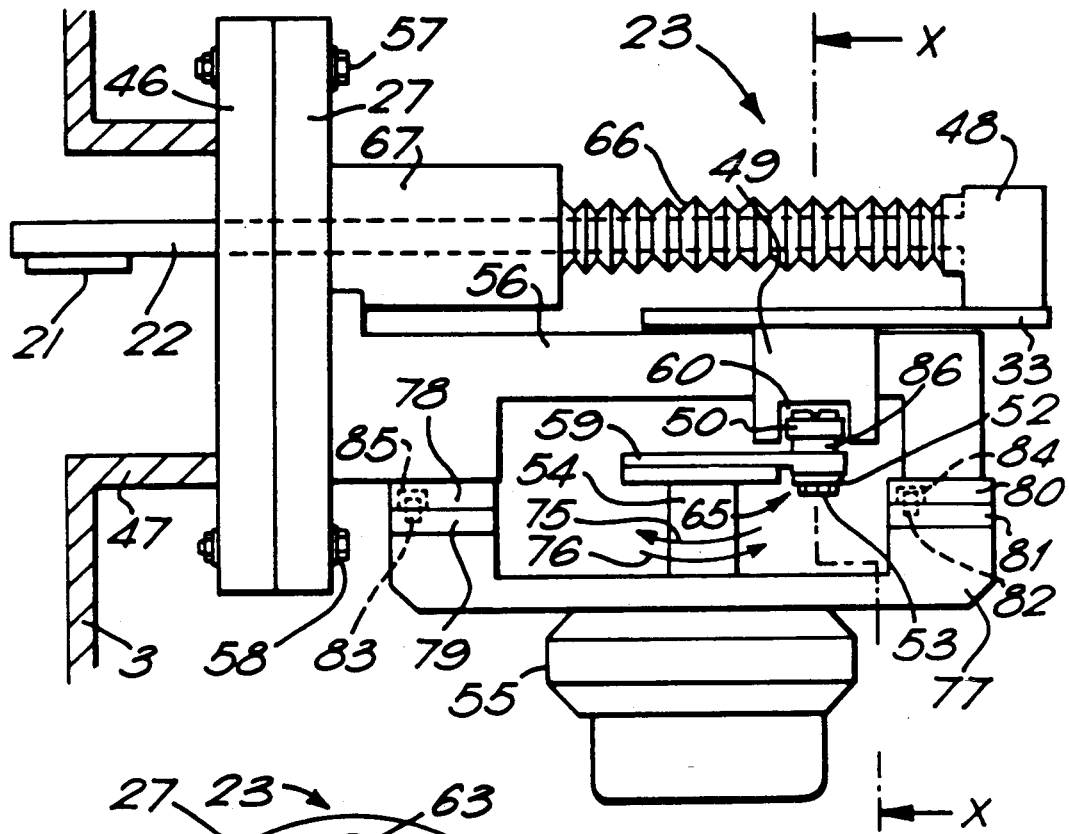
FIG. 5 is an elevation illustrating the shutter control.
Figure 6:
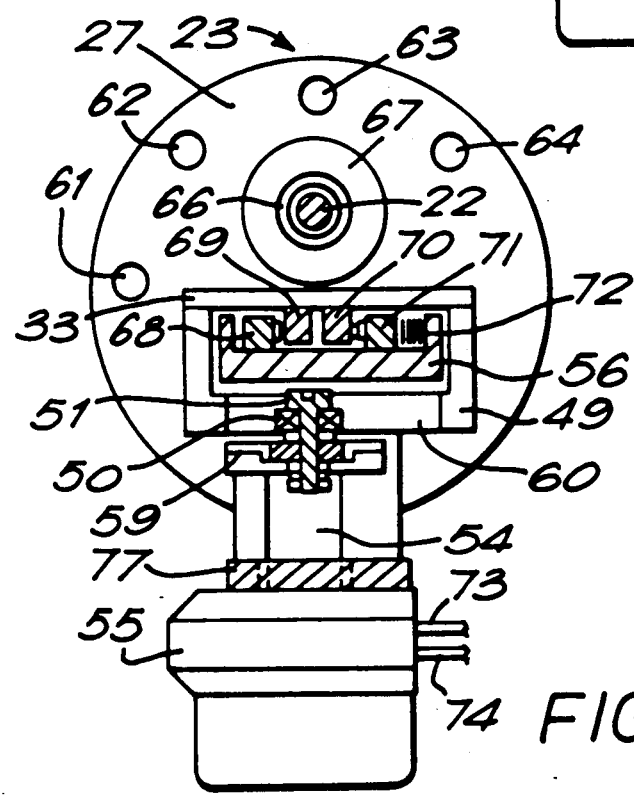
FIG. 6 is an end section taken along line X—X in FIG. 5.

FIGS. 5 and 6 show detail of the construction of control mechanism 23; FIG. 6 shows a section X—X of FIG. 5. The control mechanism 23 is mounted on flange 27 which is fixed by bolts, such as 57 and 58, to a flange 46 attached to a port 47 of vacuum enclosure 3 (FIG. 1). Flanges 27 and 46 are sealed by a UHV compatible seal; positions of bolt holes 61 to 64 are indicated in FIG. 6—some bolt holes have been omitted to aid clarity.

In FIGS. 5 and 6, shutter 21 is shown attached to shaft 22 which is fixed to a support block 48 mounted on a plate 33. Plate 33 is fixed to a cage 49 having a guideway slot 60 in which is located a pin 65 (equivalent to pin 36 of FIGS. 2, 3 and 4) comprising: a bearing 50, a screw 51, washers 52 and 86 and a nut 53. Screw 51 is located in a hole in a radius arm 59 as shown (equivalent to arm 37 of FIGS. 2, 3 and 4), and arm 59 is mounted on a pivot shaft 54 of a pneumatic actuator 55. Pneumatic actuator 55 is mounted via a mounting bracket 77 onto a support 56 which projects from flange 27. As pivot shaft 54 is rotated, pin 65 slides in slot 60 and cage 49 slides along support 56, moving plate 33, block 48 and shaft 22.

Movement of shaft 22 is accommodated by a vacuum compatible bellows 66, fixed to block 48 and housing 67 by means of suitable flanges (not shown). FIG. 6 shows linear track bearings 68, 69, 70 and 71 which are the bearings for movement of cage 49 along support 56. Bearings 69 and 70 are fixed (by screws, not shown) to plate 33 and bearings 68 and 71 are similarly fixed to support 56. Movement of cage 49 perpendicular to the axis of shaft 22 is restricted by a number of spring washers 72. The linear track bearings 68 as supplied for example by Capital Bearings Ltd of London can withstand baking (typically in excess of 200° C.) as required in order to obtain UHV conditions within vacuum enclosure 3.

A suitable pneumatic actuator 55 is supplied by Festo Pneumatics of Esslingen, West Germany. Gas, typically nitrogen or air, is supplied via pipes 73 and 74 to rotate shaft 54 through 180° alternately in the direction of either of arrows 75 or 76. To avoid damaging actuator 55 during baking it may be removed by removing mounting 77 from its location on support 56, where it is conveniently held by pairs of magnets 78 and 79, and 80 and 81. Off-centre pins 82 and 83, and pin locating holes 84 and 85 ensure that mounting 77 is replaced in the correct orientation.

What is claimed is:

1. In a method for the deposition of material onto a substrate, the material being evaporated from a source and the method including the exercise of control over the dosage of said material at said substrate by moving a shutter with substantially rectilinear motion along an axis between (i) an open position in which said shutter does not block the path of said material from said source to said substrate, and (ii) a closed position in which said shutter substantially blocks said path, a member having a pin-guiding slot angled with respect to said axis being coupled to the shutter, the improvement comprising: rotating a radius arm to which a pin is attached, said pin being located in said pin-guiding slot, and thereby urging said pin against said member and moving said shutter along said axis; beginning to decelerate said shutter before it reaches said closed position, and subsequently thereby bringing said shutter substantially to rest at said closed position.

2. The method of claim 1 wherein the step of rotating the radius arm comprises moving said shutter with acceleration directed towards, and proportional to the distance of said shutter from, a point mid-way between said open and closed positions.

3. The method of claim 1 wherein the deposition of material is by molecular beam epitaxy, and in which the source is a molecular beam source.

4. A method for the deposition of material onto a substrate comprising evaporating said material from a source, and controlling the dosage of said material at said substrate by moving a shutter between (i) an open position in which said shutter does not block the path of said material from said source to said substrate, and (ii) a closed position in which said shutter substantially blocks said path; said method comprising: alternately opening and closing said source by moving a shutter with substantially simple harmonic motion centered about a mean point located approximately mid-way between said open position and said closed position; said open and said closed positions being the two extreme displacement of said motion about said mean point.

5. The method of claim 4 wherein the step of moving the shutter comprises rotating a radius arm to which a pin is attached, said pin being located in a pin-guiding slot which is angled to an axis of movement between said open and closed positions and is formed in a member coupled to said shutter, and thereby applying a force to said member and consequently moving said shutter with substantially rectilinear motion along said axis.

6. The method of claim 5 wherein the deposition of material is by molecular beam epitaxy, and in which the source is a molecular beam source.

7. A method for the deposition of material onto a substrate comprising evaporating said material from a source, and controlling the dosage of said material at said substrate by moving a shutter between (i) an open position in which said shutter does not block the path of said material from said source to said substrate, and (ii) a closed position in which said shutter substantially blocks said path; said method comprising: rotating an actuator linked to the shutter, and thereby moving the shutter along a substantially rectilinear axis from said open position to said closed position in a closing step; accelerating the shutter away from said open position, continuing to accelerate the shutter after movement has started, and subsequently beginning to decelerate the shutter before reaching said closed position.

8. The method of claim 7 wherein the deposition of said material is by molecular beam epitaxy, and in which the source is a molecular beam source.

9. A method for the deposition of material onto a substrate comprising evaporating said material from a source, and controlling the dosage of said material at said substrate by moving a shutter between (i) an open position in which said shutter does not block the path of said material from said source to said substrate, and (ii) a closed position in which said shutter substantially blocks said path; said method including a closing step, said closing step comprising rotating an actuator linked to the shutter, and thereby moving the shutter along a substantially rectilinear axis from said open to said closed position during substantially the whole of a first half of a closing time, said closing time being the duration of said closing step, and subsequently decelerating the shutter, during substantially the whole of a second half of said closing time, and thereby beginning to decelerate the shutter before reaching said closed position.

10. The method of claim 9 wherein the deposition of said material is by molecular beam epitaxy, and in which the source is a molecular beam source.

11. Apparatus for the deposition of material from a source onto a substrate, said apparatus comprising a shutter disposed between said source and said substrate, there being a closed position and an open position of said shutter, said shutter blocking the path of said material from said source to said substrate when in the closed position, and in said open position said shutter permitting the passage of said material from said source to said substrate; said apparatus also comprising a shutter control mechanism for imparting movement to said shutter, said movement comprising substantially simple harmonic motion centered about a mean point substantially mid-way between said closed position and said open position of said shutter.

12. The apparatus of claim 11 wherein the deposition of material onto a substrate is by molecular beam epitaxy, and in which said source is a molecular beam source.

13. In apparatus for the deposition of material from a source onto a substrate, the apparatus comprising a shutter, there being a closed position and an open position of the shutter, in said closed position said shutter being disposed between said source and said substrate thereby blocking the path of said material from said source to said substrate, and in said open position said shutter being retracted so as to permit the passage of said material from said source to said substrate, the improvement comprising a shutter control mechanism for imparting substantially simple harmonic motion centered about a mean point substantially mid-point between said closed position and said open position to said shutter, wherein the motion of said shutter is substantially rectilinear along an axis between said closed and open positions, said shutter control mechanism comprising a radius arm, a pin attached to said arm, means for rotating said arm about a pivot, a member having a pin-guiding slot provided therein attached to said shutter, said slot being angled to said axis of movement of said shutter, and said pin being located in said pin-guiding slot, whereby rotating of said radius arm moves said pin in said pin-guiding slot, thereby applying a force to said member and moving said shutter along said axis.

14. The apparatus of claim 13 wherein the deposition of material onto a substrate is by molecular beam epitaxy, and in which said source is a molecular beam source.

15. The apparatus of claim 13 in which movement of said shutter between the extremes of said simple harmonic motion, corresponding to said closed and open positions, is achieved by rotating said radius arm through approximately 180°.

16. The apparatus of claim 15 wherein the deposition of material onto a substrate is by molecular beam epitaxy, and in which said source is a molecular beam source.

17. An apparatus for the deposition of material from a source onto a substrate and comprising a source of said material and a shutter, there being a closed position and an open position of which in said closed position said shutter is disposed between said source and said substrate thereby blocking the path of said material from said source to said substrate, and in said open position said shutter does not block the path of said material from said source to said substrate; said apparatus also comprising a shutter control mechanism for moving said shutter with movement comprising substantially simple harmonic motion centered about a mean point substantially mid-way between said closed position and said open position; and wherein said source, substrate and shutter are located within a vacuum enclosure, and said shutter control mechanism is located outside said enclosure; said apparatus also comprising: a shaft with said shutter fixed at one end and linked at its other end to said control mechanism, and a vacuum compatible linear motion feedthrough for accommodating motion of said shaft; and in which the motion of said shutter is substantially rectilinear along an axis between said closed and open positions, and in which said shutter control mechanism is mounted by means comprising a support member projecting outside of said vacuum enclosure from a flange, there being provided a cage attached to said shaft and capable of sliding along said support member parallel to said axis, and there being formed in one face of said cage a pin-guiding slot aligned substantially perpendicular to said axis; wherein also said shutter control mechanism comprises a radius arm, to which is attached a pin, and said pin is located in said pin-guiding slot; whereby rotating said radius arm moves said pin in said slot, thereby applying a force to said cage and consequently moving said shaft and said shutter along said axis with said motion.

18. The apparatus of claim 17 wherein the deposition of material onto a substrate is by molecular beam epitaxy, and in which said source is a molecular beam source.

19. The apparatus of claim 17 in which movement of said shutter between the extremes of said simple harmonic motion, corresponding to said closed and open positions, is achieved by rotating said radius arm through approximately 180°.

20. The apparatus of claim 19 wherein the deposition of material onto a substrate is by molecular beam epitaxy, and in which said source is a molecular beam source.

21. In apparatus for the deposition of material from a source onto a substrate, said apparatus comprising a shutter which has a closed position and an open position, said shutter being disposed between said source and said substrate when in the closed position thereby blocking the path of said material from said source to said substrate, and in said open position said shutter being retracted from the path of said material from said source to said substrate, the improvement comprising a shutter control mechanism comprising a rotary actuator linked to said shutter for moving said shutter along a substantially rectilinear axis between said closed and open positions, said actuator decelerating said shutter as it approaches said closed and open positions.

22. The apparatus of claim 21 wherein the deposition of material onto a substrate is by molecular beam epitaxy, and in which said source is a molecular beam source.

23. An apparatus for the deposition of material from a source onto a substrate and comprising a shutter, there being a closed position and an open position of which in said closed position said shutter is disposed between said source and said substrate thereby blocking the path of said material from said source to said substrate, and in said open position said shutter does not block the path of said material from said source to said substrate; said apparatus also comprising a shutter control mechanism for moving said shutter along a substantially rectilinear axis between said closed and open positions, and in which said shutter control mechanism comprises a radius arm, to which is attached a pin, and a means is provided to rotate said radius arm about a pivot; also, there is formed in a member attached to said shutter a pin-guiding slot, angled to said axis of movement of said shutter, and said pin is located in said pin-guiding slot, whereby rotating said radius arm moves said pin in said pin-guiding slot, thereby applying a force to said member in which said slot is formed and consequently moving said shutter along said axis.

24. The apparatus of claim 23 wherein the deposition of material onto a substrate is by molecular beam epitaxy, and in which said source is a molecular beam source.

* * * * *